United States Patent
Yu et al.

(10) Patent No.: US 9,184,291 B2
(45) Date of Patent: Nov. 10, 2015

(54) FINFET DEVICE AND METHOD OF FORMING FIN IN THE SAME

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventors: Guobin Yu, Shanghai (CN); Jing Lin, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/189,448

(22) Filed: Feb. 25, 2014

(65) Prior Publication Data
US 2015/0060961 A1    Mar. 5, 2015

(51) Int. Cl.
| H01L 21/84 | (2006.01) |
|---|---|
| H01L 29/78 | (2006.01) |
| H01L 29/66 | (2006.01) |

(52) U.S. Cl.
CPC ........ *H01L 29/785* (2013.01); *H01L 29/66818* (2013.01)

(58) Field of Classification Search
CPC ............... H01L 21/823431; H01L 21/823821; H01L 29/41791; H01L 29/785
USPC .......... 257/288, 369, 347, 368; 438/151, 283, 438/197, 199
See application file for complete search history.

(56) References Cited

U.S. PATENT DOCUMENTS

| 8,415,210 B2 * | 4/2013 | Oh et al. ........................ 438/197 |
| 8,741,723 B2 * | 6/2014 | Chi ............................. 438/299 |
| 2012/0261756 A1 * | 10/2012 | Kanike et al. ................. 257/350 |
| 2013/0105914 A1 * | 5/2013 | Lin ............................... 257/402 |
| 2014/0246695 A1 * | 9/2014 | Chen et al. .................... 257/190 |

* cited by examiner

*Primary Examiner* — Jarrett Stark
*Assistant Examiner* — Shahed Ahmed
(74) *Attorney, Agent, or Firm* — Kilpatrick Townsend and Stockton LLP

(57) ABSTRACT

A method for manufacturing a fin for a FinFET device includes providing a semiconductor substrate, forming a plurality of implanted regions in the semiconductor substrate, and epitaxially forming fins between two adjacent implanted regions. The method also includes forming an insulating structure between two adjacent fins.

14 Claims, 4 Drawing Sheets

FINFET DEVICE AND METHOD OF FORMING FIN IN THE SAME

CROSS-REFERENCES TO RELATED APPLICATIONS

The present invention claims priority to Chinese Application No. 201310379313.8, filed with the State Intellectual Property Office of People's Republic of China on Aug. 28, 2013, the content of which is incorporated herein by reference in its entirety.

FIELD OF THE INVENTION

The present invention relates to semiconductor manufacturing processes, and more particularly to a method for forming a fin for a FinFET device and a FinFET device having a fin-shaped channel.

BACKGROUND OF THE INVENTION

As semiconductor technology continues to evolve, improvement of IC performance is mainly achieved through shrinking the size of integrated circuit devices to increase their speed. Currently, advances in the semiconductor enable high density, high performance, and low cost manufacturing of electronic devices. However, the feature sizes of nanotechnology are constrained by physical limits.

As CMOS device dimensions continue to shrink, the challenges in manufacturing processes lead to a three-dimensional design, such as the development of fin field effect transistors (FinFETs). In comparison to conventional planar transistors, FinFET technology is used in advanced semiconductor devices having 22 nm nodes and below, which can effectively control the devices as a result of scaling to overcome the short channel effect and improve the transistor density. In a FinFET device, the gate is formed around the fin shaped channel, so that the static electricity can be controlled from three sides for a more prominent performance of electrostatic control.

Conventional techniques of forming a fin shaped channel FinFET device use the following process steps: First, a buried oxide is formed on a silicon layer to produce a silicon on insulator (SOI) structure; next, a second silicon layer is formed on the silicon on insulator structure, the second silicon layer may be monocrystalline or polycrystalline material; the second silicon layer is then patterned by etching to form a fin-shaped channel. Thereafter, a gate structure is formed around the sides and the top surface of the fin-shaped channel, and a stressed silicon-germanium structure is formed at two opposite sides of the fin-shaped channel.

The above-described process of forming a fin-shaped channel uses a <110>, <100> or <111> surface orientation. When a high-k-metal gate process is used to form a high k-metal gate structure disposed on both sides of the fin-shaped channel, the surface roughness of the fin-shaped channel will affect the changes in the metal work function under the gate metal layer, resulting in a decrease in electrical properties of the high k-metal gate structure.

BRIEF SUMMARY OF THE INVENTION

Embodiments of the present invention provide a method of manufacturing a fin for a FinFET device. The method includes providing a semiconductor substrate, forming a plurality of implanted regions in the semiconductor substrate, and forming a fin between two adjacent implanted regions.

In an embodiment, forming the plurality of implanted regions includes depositing a photoresist layer on the semiconductor substrate and patterning the photoresist layer, performing an ion implantation on the semiconductor substrate using the patterned photoresist as a mask, removing the photoresist layer, and etching back the semiconductor substrate to expose the plurality of implanted regions.

In an embodiment, the patterned photoresist has an opening having a width in the range of 10 nanometers (nm) to 200 nm.

In an embodiment, the ion implantation includes dopants selected from the group consisting of carbon (C), germanium (Ge), indium (In), gallium (Ga), natrium (N), phosphorus (P) or antimony (Sb).

In an embodiment, the dopants are implanted with an energy in the range of about 1 to about 5 keV and a dose in the range of about $5.0 \times 10^{15}$ to about $5.0 \times 10^{18}$ atoms/cm$^2$.

In an embodiment, the patterned photoresist may be removed by ashing.

In an embodiment, the etching back is performed by a wet etching.

In an embodiment, the fin material may be Si, SiGe, SiSn, or GeSn.

In an embodiment, the fin has a <501> surface orientation.

In an embodiment, the fin has a width in the range of 2 nm to 200 nm and a height in the range of 5 nm to 100 nm.

In an embodiment, after the formation of the fin, the method further comprises forming an insulating structure between two adjacent fins. In an embodiment, the formation of the insulating structure may include depositing an insulating layer that completely covers the fin, planarizing the insulating layer using a chemical mechanical polishing (CMP) process to expose the top surface of the fin, and removing a portion of the insulating layer.

In an embodiment, the insulating layer may be $SiO_2$. In an embodiment, the insulating layer is formed by a chemical vapor deposition process. In an embodiment, the removal of the portion of the insulating layer uses an etching back process. The etching back process may be a wet etching or dry etching process.

Embodiments of the present invention also provide a FinFET device comprising a semiconductor substrate, a plurality of implanted regions in the semiconductor substrate, a plurality of fins, each of the fins is disposed between two adjacent implanted regions, and an insulating structure disposed between two adjacent fins.

In an embodiment, the fin of the FinFET device includes a <501> surface orientation. The fin has a width in the range of about 2 nm to about 200 nm and a height in the range of about 5 nm to about 100 nm. In an embodiment, the fin material is Si, SiGe, SiSn, or GeSn.

BRIEF DESCRIPTION OF THE DRAWINGS

The invention will become fully apparent from the following detailed description in conjunction with the accompanying figures. It is noted that some elements in the figures are illustrated for simplicity and clarity and have not been drawn to scale.

DETAILED DESCRIPTION OF THE INVENTION

In the following description, specific details are given in order to provide a more thorough understanding of the present invention. However, it will be apparent to one skilled in the art that the present invention may be practiced without the specific details. In other examples, well known features are omitted or simplified in order not to obscure the present invention.

For a thorough understanding of the present invention, the following detailed process steps together with the accompanying drawings describe a method for forming a fin shaped channel in a FinFET device. The preferred embodiment of the present invention will now be described in detail with reference to the accompanying figures. While various details are set forth in the following description, it will be appreciated that the present invention may be practiced without these specific details, and that numerous variations may be made to the invention.

It should be understood that, as used herein, the terms "comprises," "comprising," "contains," "containing, "includes, "including," or any variation thereof, imply the inclusion of stated features, integers, steps, operations, elements, or components, but can include other additional features, integers, steps, operations, elements, components, and/ or combinations thereof.

Figure 1A:
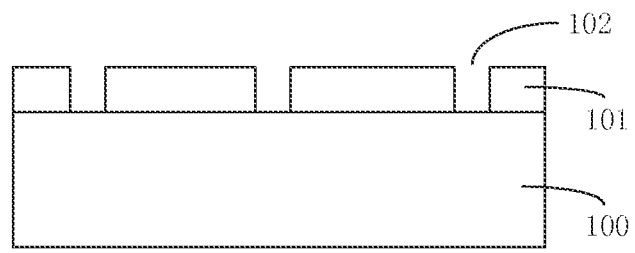
FIG. 1A through FIG. 1F are cross-sectional views showing various intermediate steps of a method according to an exemplary embodiment of the present invention.
Figure 1B:
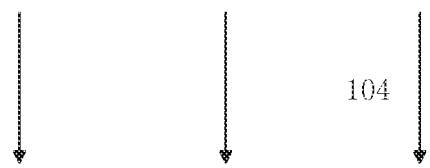
Figure 1B:
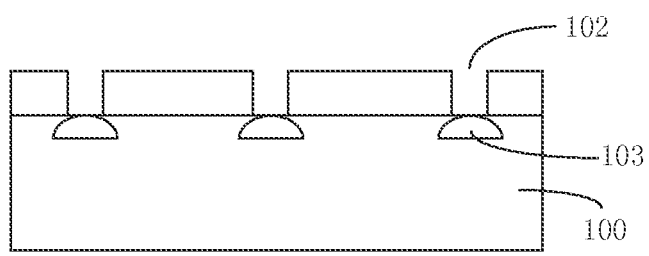
Figure 1C:
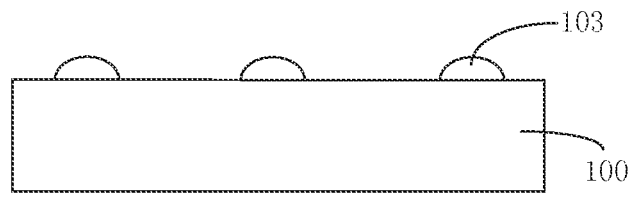
Figure 1D:
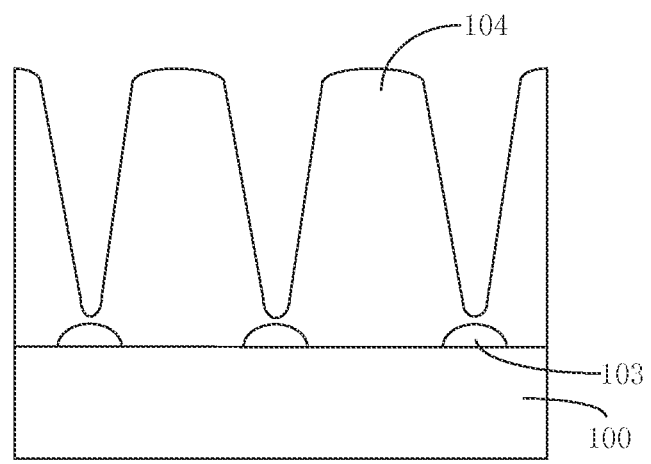
Figure 1E:
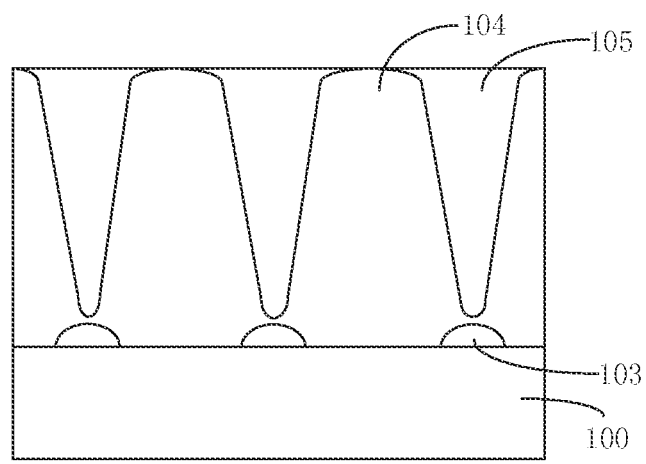
Figure 1F:
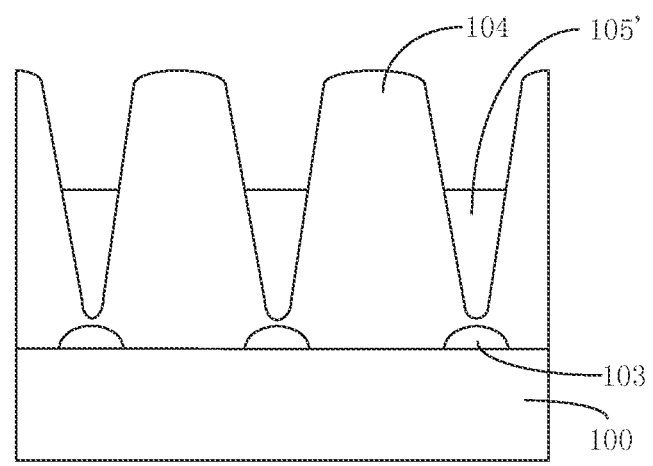
Figure 2:
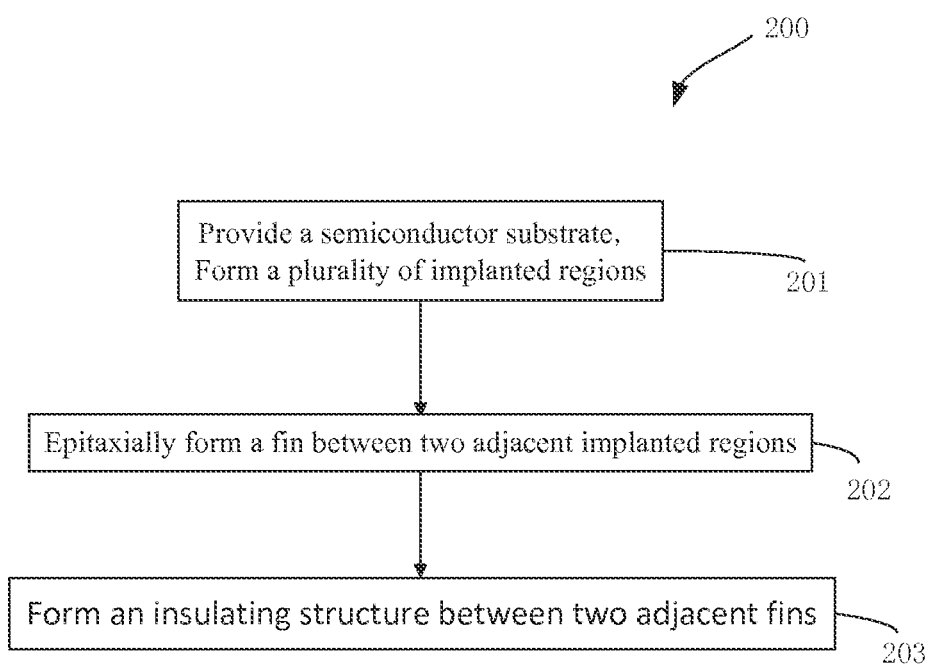
FIG. 2 is a flow chart of a method for forming a fin shaped channel FinFET device according to an exemplary embodiment of the present invention.

FIGS. 1A through 1F together with FIG. 2 describe a method of forming a fin shaped channel FinFET device according to an exemplary embodiment of the present invention.

FIGS. 1A through 1F are cross-sectional views illustrating sequential steps in fabrication of a fin for a FinFET device according to an exemplary embodiment of the present invention.

Referring now to FIG. 1A, a semiconductor substrate 100 is shown, the semiconductor substrate 100 may be undoped or doped single crystalline silicon. In an example embodiment, the semiconductor substrate 100 is a monocrystalline silicon.

A patterned photoresist layer 101 is formed on the semiconductor substrate 100. The pattern of the photoresist layer 101 defines an opening 102 for a subsequent ion implantation process. In one embodiment, the opening 102 has a width ranging from 10 nm to 200 nm. Forming a photoresist pattern on a device is well known in the art and will not be described herein for the sake of brevity.

Referring to FIG. 1B, ion implantation 104 is performed on a portion of the semiconductor substrate 100 to form ion implantation regions 103 using the patterned photoresist 101 as a mask. The implantation may include a dopant such as C, Ge, In, Ga, N, P, Sb, etc., with an implantation energy in the range of 1 to 5 keV and an implant dose in the range of about $5.0 \times 10^{15}$ to about $5.0 \times 10^{18}$ atoms/cm$^2$.

Referring to FIG. 1C, the photoresist layer 101 is removed and the semiconductor substrate 100 is etched back to completely expose the ion implanted regions 103. In one embodiment, the removal of the photoresist layer 101 may use an ashing process, and the etch back of the semiconductor substrate may use a wet etching process.

Thereafter, an epitaxial silicon layer 104 is grown on the semiconductor substrate 100, as shown in FIG. 1D. Due to the presence of the ion implanted regions 103, the epitaxial growth process of silicon layer 104 decreases sharply in the vicinity of the ion implanted regions 103, therefore, the silicon layer 104 forms a plurality of fins, each fin is disposed between two adjacent implanted regions 103. In an embodiment, each fin has a width in the range of 2 nm to 200 nm and a height in the range of 5 nm to 100 nm. In other exemplary embodiments, the silicon layer 104 can be replaced by a SiGe layer, a SiSn layer, or a GeSn layer.

It should be noted that, because the formation of the fin for a fin shaped channel FinFET device has a <501> surface oriented fin in the above-described processes, the surface roughness of the fin is thus significantly decreased. Due to the very low surface roughness of the fin, subsequent processes after forming a metal gate structure does not affect the changes in the work function of metal gate structure to ensure good performance and electric properties of the FinFET device.

Thereafter, as shown in FIG. 1E, an insulating layer 105 is formed between the fins 104. In an embodiment, the insulating layer 105 may be formed by a chemical vapor deposition process to completely cover the fins 104. Thereafter, a chemical mechanical polishing process is performed on the insulating layer 105 to expose the top surface of the fins. In an embodiment, the insulating layer 105 is $SiO_2$.

Subsequently, as shown in FIG. 1F, a portion of the insulating layer 105 is removed to form an isolation structure 105' between the fins. In an embodiment, the portion of the insulating layer may be removed using an etch back process, the etch back process may be a dry etching or wet etching process.

Thus, in accordance with the principles of the present invention, the structure formed, as shown in FIG. 1F, is an intermediate structure that accommodates formation of a FinFET device. For the completion of the FinFET device, conventional frontend manufacturing processes of a FinFET device can be used.

In an exemplary embodiment, a gate structure (not shown) is firstly formed around the side surfaces and the top surface of a fin, which is formed according to processes described above. As an example, a stacked gate structure includes sequentially from the bottom to the top a gate dielectric layer, a gate electrode layer, and a hard mask layer.

In a specific embodiment, the gate dielectric layer may include an oxide material such as silicon dioxide ($SiO_2$). $SiO_2$ used as a gate dielectric material layer may be formed by a rapid thermal oxidation (RTO) process, and the gate dielectric layer thus formed may have a thickness in the range of 8-50 Å.

The gate electrode layer may include materials such as polysilicon, metal, conductive metal nitride, conductive metal oxide, and one or more metal silicides. The metal may be tungsten (W), nickel (Ni) or titanium (Ti). The conductive metal nitride may comprise titanium nitride (TiN). Conductive metal oxide may comprise iridium oxide ($IrO_2$). Metal silicide may comprise titanium silicide (TiSi). The polysilicon layer used for the gate electrode layer may be formed using a low pressure chemical vapor deposition (LPCVD) process, the process conditions include silane ($SiH_4$) as the reaction gas with a flow rate in the range of 100~200 sccm, and preferably 150 sccm, in a reaction chamber at a temperature in the range of 700-750° C. under a reaction chamber pressure of 250~350 mTorr, and preferably 300 mTorr. In an embodiment, the reaction gas may further include a buffer gas, and the buffer gas is helium (He) or nitrogen (N2), with a flow rate of 5 to 20 liters/minute (slm), and preferably 8 slm, 110 slm or 15 slm.

The gate hard mask layer may include oxides, nitrides, nitrogen oxides, amorphous carbon. The oxides may include boron phosphosilicate glass (BPSG), phosphosilicate glass (PSG), tetraethyl orthosilicate (TEOS), undoped silicate glass (USG), spin-on glass (SOG), high density plasma (HDP) or spin coating, dielectric (SOD). Nitrides may comprise silicon nitride (SiN). Nitrogen oxides may include silicon oxynitride (SiON). The gate hard mask layer may be formed using any conventional processes, the chemical vapor deposition process is preferred (CVD), such as low temperature chemical vapor deposition (LTCVD), low pressure chemical vapor deposition (LPCVD), rapid thermal chemical vapor deposition (RTCVD), plasma enhanced chemical vapor deposition (PECVD).

Thereafter, ion implantation is performed on portions of the fin that are not covered by the gate structure to form source/drain regions (not shown). Then, offset sidewall spacers are formed close to both sides of the gate structure. The sidewalk spacers may include $SiO_2$, SiN, SiON, or any combinations thereof. In the process of forming offset sidewall spacers, offset sidewall spacers may also be formed on sides of the fin. Thereafter, the offset sidewall spacers on both sides of the fin are removed. Then, using the offset sidewall spacers as a mask, an epitaxial growth process is used to expand the area of the fin that is outside of the gate electrode structure to reduce the resistance of the previously formed source/drain regions.

Thereafter, a chemical mechanical polishing process is performed sequentially on the contact etch stop layer having a stress characteristic and the interlayer dielectric layer formed on the semiconductor substrate 100 to expose the top surface of the gate structure. Then, the gate structure is removed to form a groove, and a high k-metal gate structure is formed in the groove, as an example, the gate structure comprises a high-k dielectric layer, a cover layer, the work function metal layer, the barrier layer and the metal material layer from bottom to top. Thereafter, an interlayer dielectric layer is formed and thereafter, contact holes are formed in the interlayer dielectric layer exposing the top surface of the metal gate structure and the source/drain regions. Thereafter, a self-aligned silicide is formed through the contact holes on the exposed top surface of the metal gate structure and the source/drain regions, the contact holes are then filled with a metal (usually tungsten). The contact holes are formed in a backend manufacturing process that includes the formation of interconnect metal layer and the self-aligned silicide contact plug.

Thereafter, a conventional FinFET device can be implemented using a backend manufacturing process that may comprise: forming a plurality of interconnected metal layers, which may be implemented using a dual damascene process, and forming metal pads for the implementation of a wire bonding package.

FIG. 2 is a flow chart of a method 200 for fabricating a fin for a FinFET device having a fin-shaped channel according to an exemplary embodiment of the present invention.

As shown in block 201, method 200 begins by providing a semiconductor substrate, and forming a plurality of ion-implanted regions in the semiconductor substrate.

As shown in block 202, method 200 epitaxially forms a plurality of fins on the semiconductor substrate, each fin is epitaxially grown between two adjacent ion implanted regions to form a fin-shaped channel for the FinFET device.

In block 203, an insulating structure is formed between two adjacent fins.

According to the present invention, the fin-shaped channel formed in the fin having a <501> surface orientation, therefore, the fin has a very low surface roughness. A high k metal gate structure that is subsequent formed around the sides and the top surface of the fin-shaped channel does not affect the changes in the work function of the metal gate structure to ensure good performance and electric properties of the FinFET device.

As shown in FIG. 1F, embodiments of the present invention provide a FinFET device comprising: a semiconductor substrate 100, a plurality of implanted regions 103 formed on the semiconductor substrate 100, a plurality of fins 104 formed on the semiconductor substrate, and an insulating structure 105' formed between two adjacent fins.

The invention has been carried out by the above described embodiments, it is to be understood that the above embodiments are merely examples and for purposes of illustration and not intended to limit thereto. It is intended to cover various modifications. Therefore, the scope of the appended claims and their equivalents should be accorded the broadest interpretation so as to encompass all such modifications.

What is claimed is:

1. A method of manufacturing a fin for a FinFET device, the method comprising:
   providing a semiconductor substrate;
   forming a plurality of implanted regions in the semiconductor substrate; and
   epitaxially forming the fin between two adjacent implanted regions, wherein the fin has a <501> surface orientation.

2. The method of claim 1, wherein forming a plurality of implanted regions comprises:
   forming a patterned photoresist layer;
   forming the implanted regions by ion implantation using the patterned photoresist layer as a mask; and
   removing the photoresist layer and etching back the semiconductor substrate to expose the plurality of implanted regions.

3. The method of claim 2, wherein the patterned photoresist layer comprises a window having a width in a range between 10 nm and 200 nm.

4. The method of claim 2, wherein the ion implantation comprises using ions selected from the group consisting of C, Ge, In, Ga, N, P, or Sb.

5. The method of claim 4, wherein the ion implantation is performed at an energy of about 1 to 5 keV, an implant dose of about $5.0 \times 10^{15}$ to $5.0 \times 10^{18}$ atoms/cm$^2$.

6. The method of claim 2, wherein removing the photoresist layer comprises an ashing process.

7. The method of claim 2, wherein etching back the semiconductor substrate comprises wet etching.

8. The method of claim 1, wherein the fin comprises Si, SiGe, SiSn, or GeSn.

9. The method of claim 8, wherein the fin has a width in a range between 2 nm and 200 nm and a height in a range between 5 nm and 100 nm.

10. The method of claim 1, wherein further comprising:
    after forming the fin, forming an insulating structure on sides of the fin.

11. The method of claim 10, wherein forming an insulating structure comprises:
    forming the insulating structure completely covering the fin;
    performing a chemical mechanical polishing process on the insulating structure to expose the top surface of the fin; and
    removing a portion of the insulating structure.

12. The method of claim 11, wherein the insulating structure is made of $SiO_2$.

13. The method of claim 11, wherein the insulating structure is formed by a chemical vapor deposition process.

14. The method of claim 11, wherein removing a portion of the insulating structure comprises wet etching or dry etching.

* * * * *